United States Patent
Koch

(10) Patent No.: US 7,253,757 B2
(45) Date of Patent: Aug. 7, 2007

(54) SIGMA-DELTA MODULATOR HAVING A CLOCKED DELAY LINE

(75) Inventor: Rudolf Koch, Oberhaching (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/909,182

(22) Filed: Jul. 30, 2004

(65) Prior Publication Data

US 2005/0024248 A1 Feb. 3, 2005

(30) Foreign Application Priority Data

Jul. 31, 2003 (DE) ................................ 103 35 108

(51) Int. Cl.
*H03M 3/02* (2006.01)

(52) U.S. Cl. ..................................................... 341/143
(58) Field of Classification Search ................. 341/143
See application file for complete search history.

(56) References Cited

U.S. PATENT DOCUMENTS

| | | | |
|---|---|---|---|
| 3,999,152 A | | 12/1976 | Sato et al. ...................... 333/70 |
| 4,528,684 A | * | 7/1985 | Iida et al. ...................... 377/60 |
| 5,392,042 A | | 2/1995 | Pellon ......................... 341/143 |
| 5,515,046 A | * | 5/1996 | Mandl ......................... 341/143 |
| 5,608,400 A | * | 3/1997 | Pellon ......................... 341/143 |
| 5,673,044 A | * | 9/1997 | Pellon ......................... 341/143 |

OTHER PUBLICATIONS

Paul, S.A. et al., A Nyquist-Rate Pipelined Oversampling A/D Converter, Dec. 1999, IEEE Journal of Solid-State Circuits, vol. 34 No. 12, pp. 1777-1787.*
Hernandez, L. et al., Continuous-Time Sigma-Delta modulators with transmission line resonators and improved jitter and excess loop delay performance, IEEE Proceedings of the 2003 International Symposium on Circuits and Systems, ISCAS 03; vol. 1 pp. 989-992.*
N. Tan, et al.; "Switched-Capacitor Circuits Using Delay-Line Elements"; Electronics Letters, vol. 29, No. 2, p. 159-160, Jan. 21, 1993.
S. R.. Norsworth; "Delta-Sigma Data Converters: Theory, Design, and Simulation"; IEEE (ISBN:0780310454), 1996.
"Charge-Coupled Device (CCD) Image Sensors"; CCD Primer MTD/PS-0218; Eastman Kodak Company, Rochester, New York, May 29, 2001.
R. Timothy Edwards, et al.; "A Mixed-Signal Correlator for Acoustic Transient Classification"; Conference Paper ISCAS, 1997.
J.B. Calvert; "Analog Delay Devices"; www.du.edu/-etuttle/electron/elect39.htm. Jan. 13, 2002.

* cited by examiner

*Primary Examiner*—Howard L. Williams
(74) *Attorney, Agent, or Firm*—Baker Botts L.L.P.

(57) ABSTRACT

A sigma-delta modulator is provided with a filter for noise shaping, with the filter having at least one delay line (DL). The delay line (DL) is a clocked line.

20 Claims, 1 Drawing Sheet

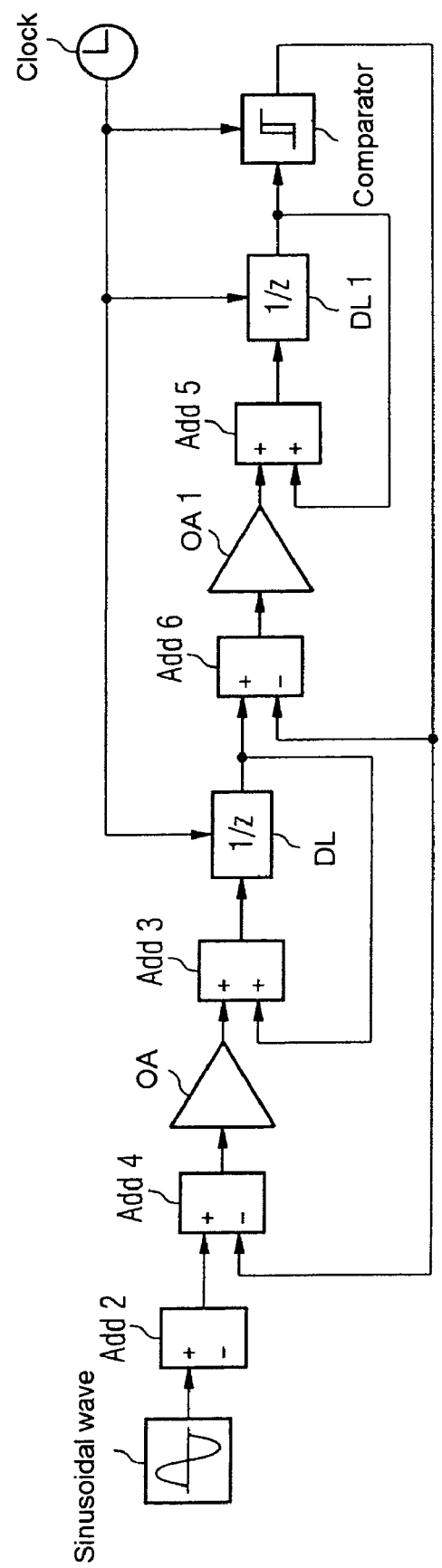

SIGMA-DELTA MODULATOR HAVING A CLOCKED DELAY LINE

PRIORITY

This application claims priority to German application no. 103 35 108.6 filed Jul. 31, 2003.

TECHNICAL FIELD OF THE INVENTION

The present invention relates to a sigma-delta modulator (SDM).

BACKGROUND OF THE INVENTION

To begin with, it should be noted that the terms "sigma-delta modulator (SDM)" and "sigma-delta converter" are used interchangeably below. In terms of hardware, an SD AD converter comprises a modulator with a downstream digital filter.

Basic details of the prior art of sigma-delta modulators can be found in: Norsworthy, S. R.; Schreiber, R.; Temes, G. C.: Delta-Sigma Data Converters: Theory, Design, and Simulation.—IEEE, November 1996 (ISBN: 0780310454).

Sigma-delta modulators form the basis of the AD converters which are preferably used in wire-based and wire-free communication. The trend towards increasingly more advanced digital signal processing and, as a result thereof, towards AD conversion as close to the input or antenna as possible means that there is a need for converters having an ever higher resolution and wider bandwidth.

The object of providing converters having a wide bandwidth and high resolution in conjunction with a simultaneously moderate power consumption therefore arises for mobile applications.

There are, in principle, three ways of increasing the resolution of sigma-delta modulators:

- by increasing the resolution of the quantizer (more bits)—this is associated with linearity problems on account of element mismatch;
- by raising the order and/or Q-factor of the filters in the modulator—this is associated with stability problems;
- by increasing oversampling—in this case, the power loss increases with at least the square of the clock frequency. In addition, the requirements imposed on the maximum permissible clock jitter become more stringent as the clock frequency increases.

There are two customary SDM embodiments in the prior art:

a) Discrete-time converters based on switched-capacitor technology. The input signal is sampled at the SDM's input. This embodiment is resistant to parameter fluctuations, not very sensitive to clock jitter and is therefore the most common embodiment. Its fundamental disadvantage is the need to select the bandwidth of the operational amplifiers such that it is at least five times to ten times the magnitude of the clock frequency. In addition, the capacitor reset noise (kTC noise) predetermines a minimum size for the capacitors used. As a result, these converters increasingly draw a very large amount of current at high clock frequencies of above approximately 50 MHz and/or high resolutions (above approximately 16 bits). Sampling at the SDM's input requires additional input filters in order to avoid aliasing, said input filters occupying an even larger area and further increasing the power consumption. They therefore do not constitute a suitable solution for mobile applications having a high resolution and wide bandwidth.

b) Converters based on continuous-time integrators. The integrators are usually implemented using RC, IC or gmC technology. These converters are sensitive to parameter fluctuations which affect the time constant. However, their fundamental disadvantage in customary embodiments is the considerably higher jitter sensitivity than SC solutions. The reason for this is integration via the feedback signal, so that the time integral via the signal which has been fed back (generally a current) determines the circuit's response. As a result, the clock jitter directly affects the feedback signal. Since the amplitude of the feedback signal is, in general, considerably higher than the amplitude of the input signal, the jitter sensitivity is increased further as a result. These continuous-time converters are thus suitable for higher clock rates, since the bandwidth of the operational amplifiers has to correspond only approximately to the clock frequency in this case. Low-pass filtering of the input signal is generally carried out together with noise shaping in the same filter blocks within the SD modulator, so that an anti-aliasing input filter is not usually required.

c) In accordance with a new proposal by Prof. Hernandez, University of Madrid, it is also possible to implement SDMs based on delay lines instead of integrators. Although, conceptually, this provides a good compromise between speed (since time-continuous) and jitter sensitivity, suitable continuous-time delay lines cannot, in practice, be integrated in silicon ICs. Customary and suitable separate delay lines are based on SAW, BAW or distributed LC concepts. All of these embodiments have a very low impedance (typically 50 to 200 ohm), again giving rise to a high power consumption. Therefore, neither does this interesting concept constitute a practical solution for the requirements mentioned.

SUMMARY OF THE INVENTION

The invention is based on the object of providing an SDM which, in comparison to the SDMs which are disclosed in the prior art and have hitherto been implemented in practice, has a lower power loss in conjunction with a wider bandwidth.

This object can be achieved according to the invention by a sigma-delta modulator comprising a filter for noise shaping, wherein the filter comprises at least one delay line, and wherein the delay line is a clocked line.

The delay line can be a continuous-amplitude line. The modulator can be designed in such a manner that the delay line(s) is/are clocked at the comparator clock rate of the sigma-delta modulator. The modulator can be designed in such a manner that the delay line(s) is/are clocked at a clock rate which is considerably higher than the comparator clock rate of the sigma-delta modulator. The modulator may have at least one operational amplifier which is operated in a time-continuous manner and is connected in series with the at least one delay line. The modulator may have two delay lines and two operational amplifiers in a resonator loop. The modulator can be in the form of a cascaded converter. The delay line(s) can be integrated by means of BBDs and/or CCDs.

BRIEF DESCRIPTION OF THE DRAWINGS

Advantageous and preferred exemplary embodiments of the SDM according to the invention are explained below using the FIGURE.

The FIGURE shows, as an exemplary embodiment of an SDM according to the invention, the circuit diagram of a second-order SDM having low-pass filtering in the forward path.

PREFERRED EMBODIMENTS OF THE INVENTION

In this case, use is made of the well-known principle (also used by Hernandez) of designing low-pass filtering around a delay line (DL). According to the invention, however, a clocked (but continuous-amplitude) line (DL) is used instead of a continuous-time line as in the prior art. There are various integrated implementations for said clocked line:
Bucket Brigade Devices (BBD),
Charge Coupled Devices (CCD).

Both devices as such have been mass-produced in integrated form for a long time, proving their suitability for production. Reference should be made in this connection to the following documents:
Re CCDs:
U.S. Pat. No. 3,999,152,
Eastman Kodak CCD Primer MTD/PS-0218, Revision No. 1.—Eastman Kodak Company, Rochester 2001.
Re BBDs:
Edwards, R. T.; Cauwenberghs, G.; Pineda, F. J.: A Mixed-Signal Correlator for Acoustic Transient Classification.—Conference Paper ISCAS 97,
Calvert, J. B.: Analog Delay Devices—<Can be found on the Internet at http://www.du.edu/~etuttle/electron/elect39.htm>.

Since, despite the use of transistors, the two devices are virtually "passive" elements, the power consumption of the few elements required is minimal. The clock rates which can be achieved depend on the transit frequency of MOS transistors in the case of CCDs and on the maximum frequency in the case of BBDs, so that, in submicron technologies with ft, fmax values of >100 GHz, clock rates in the range of up to at least a few 100 MHz do not constitute a problem in CCDs.

A high gate/drain overlap capacitance is required for the operation of BBDs. This can be achieved, for example, by fitting a second gate strip which is connected to the transistor or by extending the gate over the drain diffusion (additional implantation may be required for this) or by means of an aluminium track having a coupling capacitance which is as high as possible.

A few special steps are generally used in CCD manufacturing technology in order to keep the transmission losses å low. These involve the use of high-impedance epitaxial layers and dual-gate technologies. Since only a few elements are used in this case, the transmission losses are not critical and special steps should not be necessary.

A higher clock frequency can generally be achieved with CCDs than with BBDs.

In the simplest form, the delay line (DL) and the comparator in the SDM are operated at the same clock rate, so that a single element suffices for the amplitude-analogous delay by one clock cycle. However, as in the case of SC-based converters, this embodiment requires an anti-aliasing input filter, but the SDM itself has only a low power consumption.

In other exemplary embodiments of the sigma-delta modulator according to the invention, the delay line (DL) is clocked at a clock rate which is considerably higher than the comparator clock rate.

The basic idea of the present invention is thus the use of a clocked delay line (DL) (which can be integrated in a simple manner and with low power consumption) as the core element in the filter used for noise shaping in sigma-delta modulators. A fast SDM with moderate power consumption can thus be implemented in conjunction with operational amplifiers (OA) which are operated in a time-continuous manner. Two variants are proposed: clocking the delay line (DL) at the comparator clock rate or clocking it at a considerably higher frequency.

This concept can be applied to virtually any known and conceivable architecture for continuous-time sigma-delta converters, in particular to any filter level, low-pass and bandpass converters, real and complex converters, single-loop and cascaded converters.

The circuit diagram (shown in the figure) of an exemplary embodiment of a second-order SDM according to the invention having low-pass filtering in the forward path shows, by way of example, only one of a large number of possible implementations, for example with a higher or lower filter level, number of bits, increased or decreased oversampling. Bandpass converters and even complex bandpass converters are also possible through the use of two delay elements (DL) and two operational amplifiers (OA) in a so-called resonator loop. Combinations with digital filtering in the feedback path, or cascaded converters, for example in line with the MASH concept, are also possible. It is also possible to implement low-pass filtering using a feed-forward architecture instead of a feedback architecture (as shown in the figure).

I claim:

1. A sigma-delta modulator comprising
a plurality of components operating in a time continuous manner,
a filter for noise shaping, wherein the filter comprises a component operating in a time continuous manner and at least one clocked delay line, wherein the plurality of components and the filter form a cascaded converter and the delay line is a continuous-amplitude line.

2. The sigma-delta modulator according to claim 1, wherein the modulator comprises a clocked comparator and is designed in such a manner that the delay line(s) is/are clocked at the comparator clock rate of the sigma-delta modulator.

3. The sigma-delta modulator according to claim 1, wherein the modulator comprises a clocked comparator and is designed in such a manner that the delay line(s) is/are clocked at a clock rate which is higher than the comparator clock rate.

4. The sigma-delta modulator according to claim 1, wherein the modulator has at least one operational amplifier which is operated in a time-continuous manner and is connected in series with the at least one delay line.

5. The sigma-delta modulator according to claim 4, wherein the modulator has two delay lines and two operational amplifiers in a resonator loop.

6. The sigma-delta modulator according to claim 1, wherein the delay line(s) is/are integrated by means of Bucket Brigade Devices (BBD) and/or Charge Coupled Devices (CCD).

7. A sigma-delta modulator comprising
a plurality of components operating in a time continuous manner, a filter for noise shaping comprising at least one clocked delay line, and a clocked comparator, wherein the delay line is a continuous-amplitude line and the comparator and the delay line are clocked with a common clock signal.

8. The sigma-delta modulator according to claim 7, wherein the modulator has at least one operational amplifier which is operated in a time-continuous manner and is connected in series with the at least one delay line.

9. The sigma-delta modulator according to claim 8, wherein the modulator has two delay lines and two operational amplifiers in a resonator loop.

10. The sigma-delta modulator according to claim 7, wherein the modulator is in the form of a cascaded converter.

11. The sigma-delta modulator according to claim 7, wherein the delay line(s) is/are integrated by means of Bucket Brigade Devices (BBD) and/or Charge Coupled Devices (CCD).

12. A sigma-delta modulator comprising:
a clocked comparator clocked by a first clock signal, and
a plurality of components operating in a time continuous manner,
a filter for noise shaping, wherein the filter comprises at least one delay line, and wherein the delay line is a clocked line clocked by a second clock signal which is higher than the first clock signal.

13. The sigma-delta modulator according to claim 12, wherein the modulator has two delay lines and the plurality of components comprise two operational amplifiers.

14. The sigma-delta modulator according to claim 12, wherein the modulator is in the form of a cascaded converter.

15. The sigma-delta modulator according to claim 12, wherein the delay line(s) is/are integrated by means of Bucket Brigade Devices (BBD) and/or Charge Coupled Devices (CCD).

16. A sigma-delta modulator comprising
a plurality of components operating in a time continuous manner,
a filter for noise shaping, wherein the filter comprises a component operating in a time continuous manner and at least one clocked delay line, wherein the plurality of components and the filter form a cascaded converter,
wherein the modulator comprises a clocked comparator and is designed in such a manner that the delay line(s) is/are clocked at a clock rate which is higher than the comparator clock rate.

17. The sigma-delta modulator according to claim 16, wherein the modulator has at least one operational amplifier which is operated in a time-continuous manner and is connected in series with the at least one delay line.

18. The sigma-delta modulator according to claim 17, wherein the modulator has two delay lines and two operational amplifiers in a resonator loop.

19. The sigma-delta modulator according to claim 16, wherein the delay line(s) is/are integrated by means of Bucket Brigade Devices (BBD) and/or Charge Coupled Devices (CCD).

20. The sigma-delta modulator according to claim 16, wherein the delay line is a continuous-amplitude line.

* * * * *